United States Patent
Zhang

(10) Patent No.: US 9,089,065 B2
(45) Date of Patent: Jul. 21, 2015

(54) ELECTRICAL CONNECTOR HAVING A CONNECTOR STANDOFF

(71) Applicant: HON HAI PRECISION INDUSTRY CO., LTD., New Taipei (TW)

(72) Inventor: Dao-Kuan Zhang, Kunshan (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 96 days.

(21) Appl. No.: 14/037,402

(22) Filed: Sep. 26, 2013

(65) Prior Publication Data

US 2014/0087594 A1    Mar. 27, 2014

(30) Foreign Application Priority Data

Sep. 26, 2012   (CN) ...................... 2012 2 0497130 U

(51) Int. Cl.
| | |
|---|---|
| H01R 13/60 | (2006.01) |
| H05K 7/14 | (2006.01) |
| H01R 12/70 | (2011.01) |
| H01R 13/514 | (2006.01) |
| H01R 24/64 | (2011.01) |

(52) U.S. Cl.
CPC ............ *H05K 7/142* (2013.01); *H01R 12/7005* (2013.01); *H01R 12/707* (2013.01); *H01R 12/7029* (2013.01); *H01R 12/7064* (2013.01); *H01R 13/514* (2013.01); *H01R 24/64* (2013.01); *H01R 2201/04* (2013.01)

(58) Field of Classification Search
CPC ...................................................... H01R 23/7073
USPC .................................................. 439/541.5, 79
See application file for complete search history.

(56) References Cited

U.S. PATENT DOCUMENTS

| | | | |
|---|---|---|---|
| 5,692,912 A | 12/1997 | Nelson et al. | |
| 6,273,732 B1 | 8/2001 | Johnescu et al. | |
| 6,749,445 B1 | 6/2004 | Chen | |
| 7,837,511 B2 * | 11/2010 | Hsu ............................... | 439/669 |
| 8,100,699 B1 | 1/2012 | Costello | |
| 2013/0244495 A1 * | 9/2013 | Li et al. ......................... | 439/676 |

* cited by examiner

*Primary Examiner* — Phuong Dinh
(74) *Attorney, Agent, or Firm* — Wei Te Chung; Ming Chieh Chang

(57) ABSTRACT

An electrical connector comprises a connector body. The connector body includes an insulative housing and a contact module received in the insulative housing. The contact module includes a spacer and a plurality of contacts received in the spacer. Each of the contacts have a foot portion for being mounted onto an external printed circuit board. The insulative housing has a plurality of mating ports defined in a vertical front face. The electrical connector also includes a connector standoff assembled under the connector body to support the connector body. The connector standoff includes a base portion and four locking arms extending from the base portion along a down-to-up direction, and two of the locking arms engage with the spacer. The foot portion extends downwardly through the connector standoff.

11 Claims, 7 Drawing Sheets

ELECTRICAL CONNECTOR HAVING A CONNECTOR STANDOFF

BACKGROUND OF THE INVENTION

1. Field of the Invention

The present invention relates to an electrical connector, and more particularly to an electrical connector having a structure to increase the height of a connector body.

2. Description of Prior Arts

U.S. Pat. No. 6,273,732 issued to Johnescu et al. on Aug. 14, 2001 discloses a through mount electrical connector with an alignment device. The connector is mountable to a substrate and includes a housing through which a plurality of contacts extend. Each contact has a contact tail that extends beyond a face of the housing. The connector includes an alignment device having a first face adjacent the housing, a second face positionable adjacent the substrate, and a plurality of apertures extending between the first face and the second face for receiving a respective contact tail. At least one latch slidably couples the alignment device to ends of the housing such that the alignment device is selectively disposable between a first position in which the contact tails generally do not extend beyond the second face of the alignment device, and a second position in which the contact tails generally extend beyond the second face of the alignment device.

U.S. Pat. No. 6,749,445 issued to Chen on Jun. 15, 2004 discloses an electrical connector including a housing, a number of terminals, a shell, and a spacer. The housing has at least a pair of engaging portions and a number of passageways. Each terminal has a mating portion received in the passageway and a tail portion extending downwardly beyond the housing. The spacer includes a pair of hooks extending upwardly from opposite ends thereof and a number of positioning holes for retaining the tail portion in position. Each hook has a first retention portion and a second retention portion positioned above the first retention portion. By means of gradual cooperation between the engaging portions and the retention portions, the terminals are gradually oriented and guided by the holes of the spacer to be precisely inserted into a number of apertures defined in a printed circuit board without buckling.

An electrical connector having a height related structure for ease of coupling to a connector body is desired.

SUMMARY OF THE INVENTION

Accordingly, an object of the present invention is to provide an electrical connector having a connector standoff.

In order to achieve the object set forth, the invention provides an electrical connector including a connector body having an insulative housing and a contact module received in the insulative housing. The insulative housing includes a vertical front face and a plurality of mating ports defined in the vertical front face. The contact module includes a spacer and a plurality of contacts received in the spacer. Each of the contacts includes a foot portion for being mounted on an external printed circuit board. The electrical connector further includes a connector standoff assembled under the connector body to support the connector body. The connector standoff includes a base portion and four locking arms extending from the base portion along a down-to-up direction, said four locking arms including two rear locking arms, said two rear locking arms engaging with the spacer. The connector standoff extends beyond a bottom face of the insulative housing, the foot portion extending downwardly through the connector standoff.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
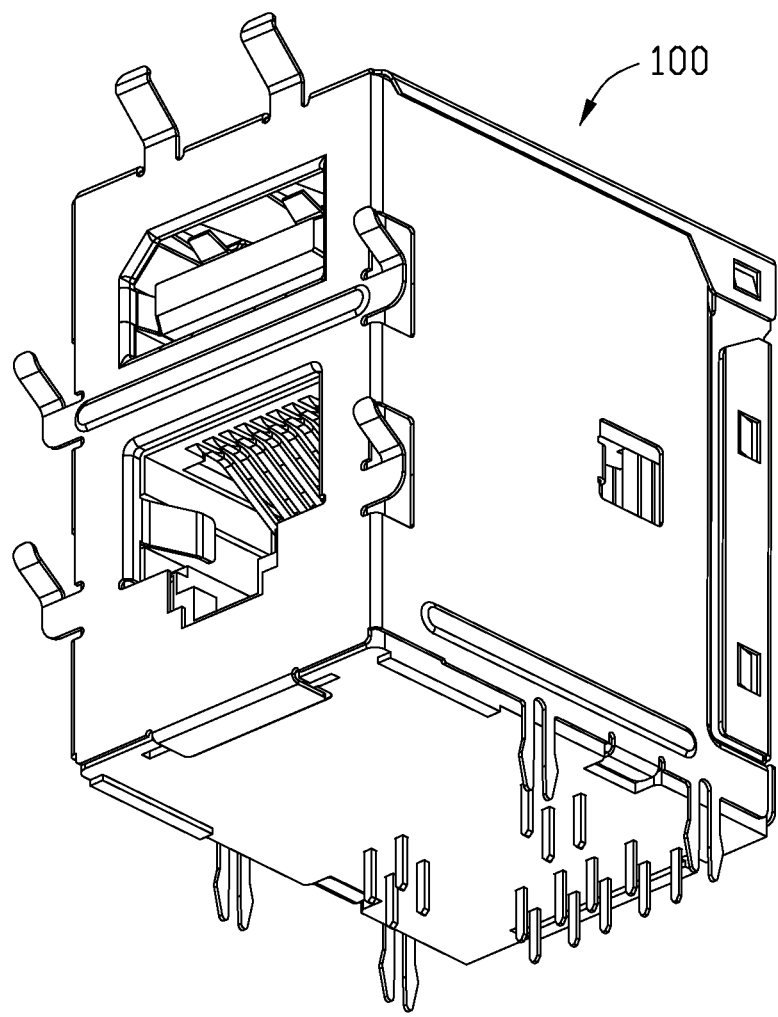
FIG. 1 is a perspective view of an electrical connector in accordance with the present invention.

Reference will now be made to the drawing figures to describe the present invention in detail.

Figure 2:
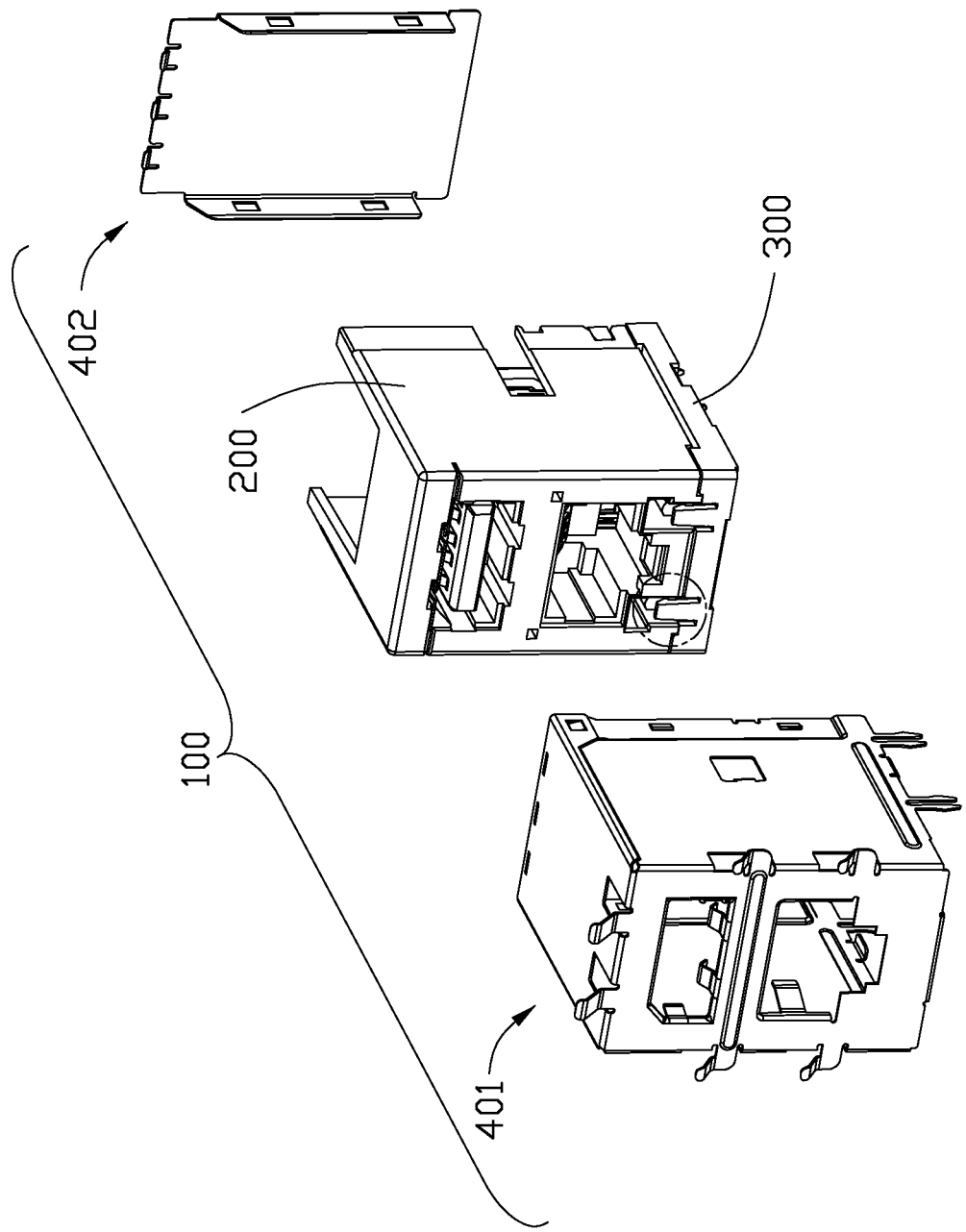
FIG. 2 is an exploded view of the electrical connector in FIG. 1.
Figure 3:
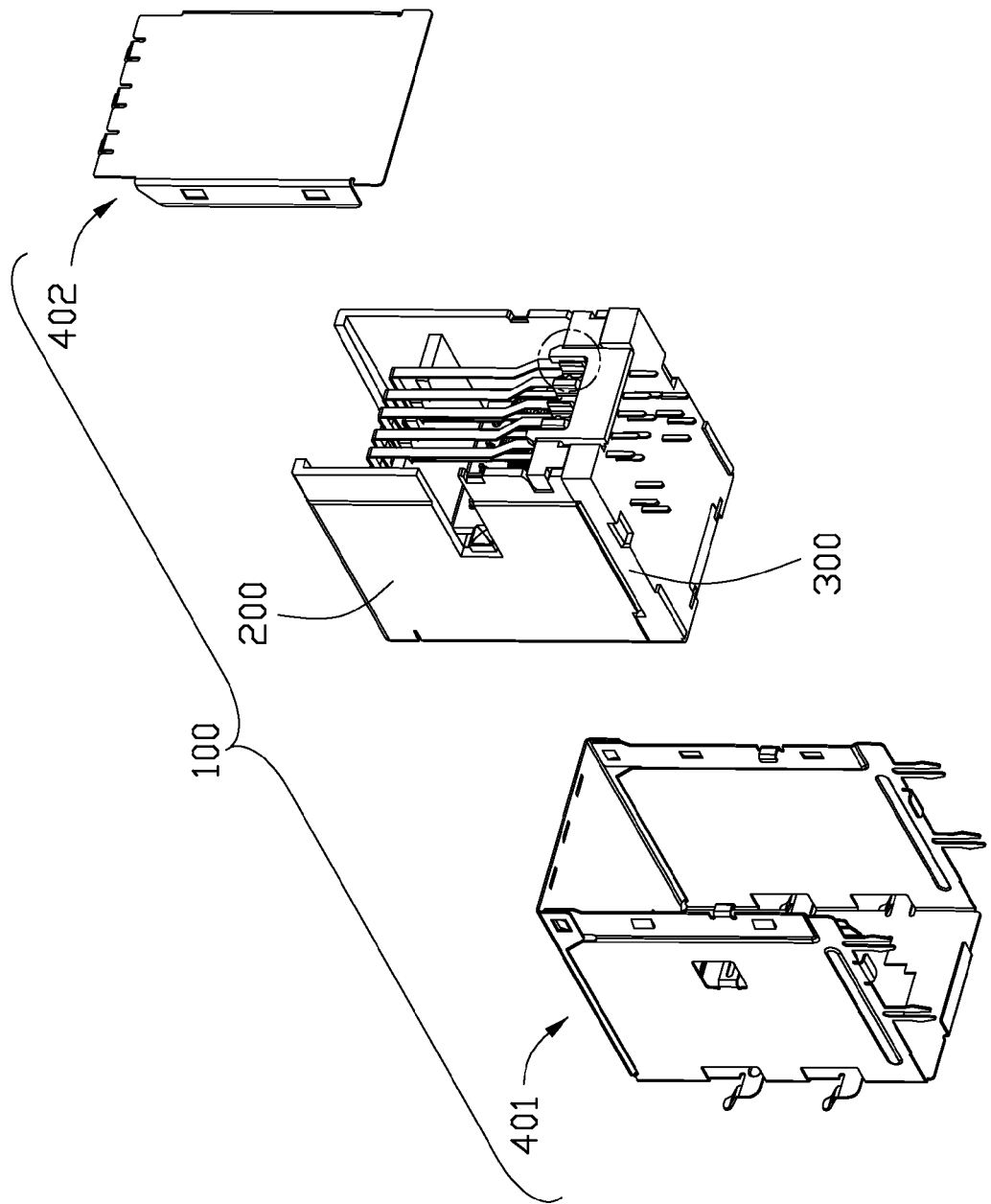
FIG. 3 is another exploded view of the electrical connector in FIG. 2.
Figure 4:
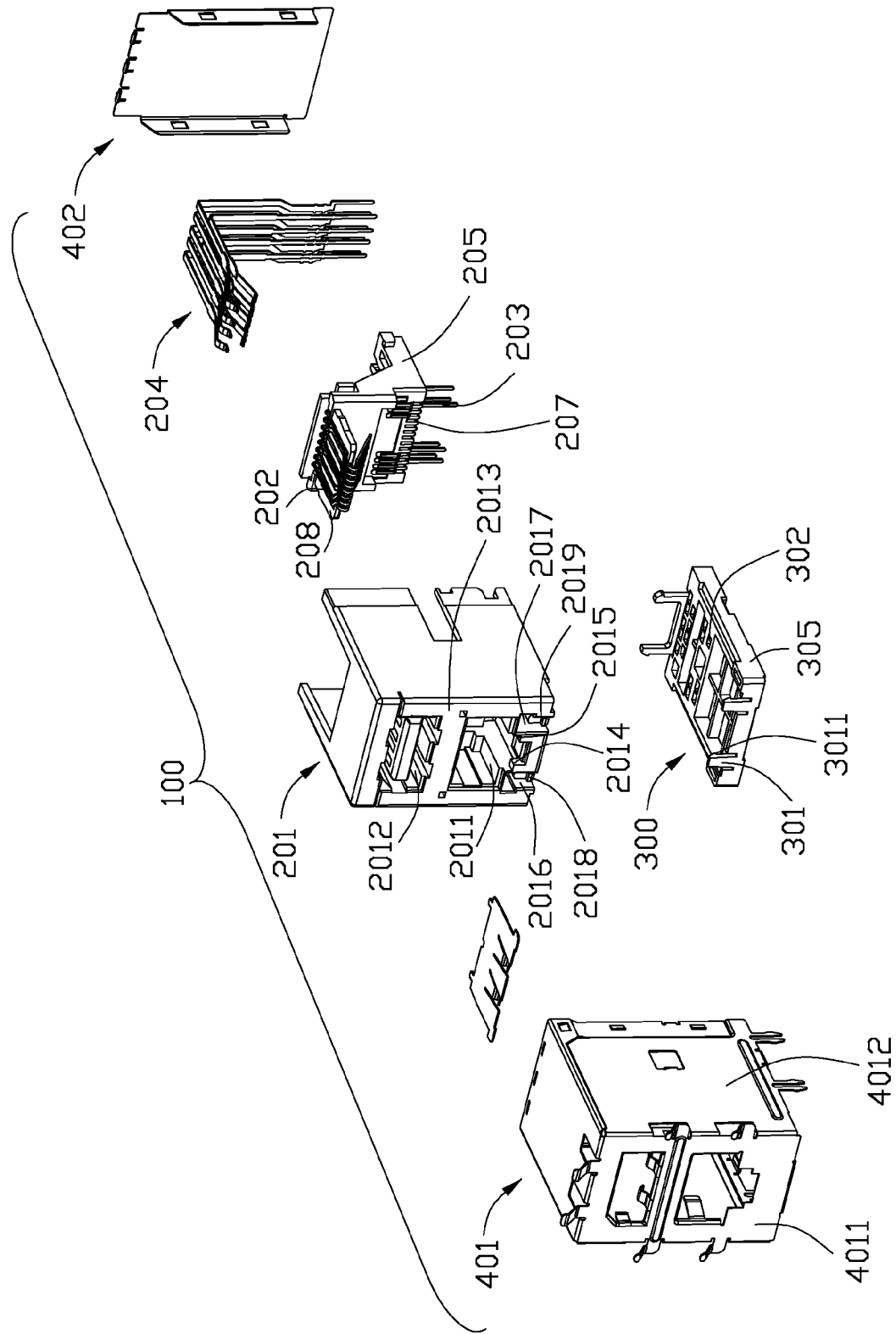
FIG. 4 is a further exploded view of the electrical connector in FIG. 3.
Figure 5:
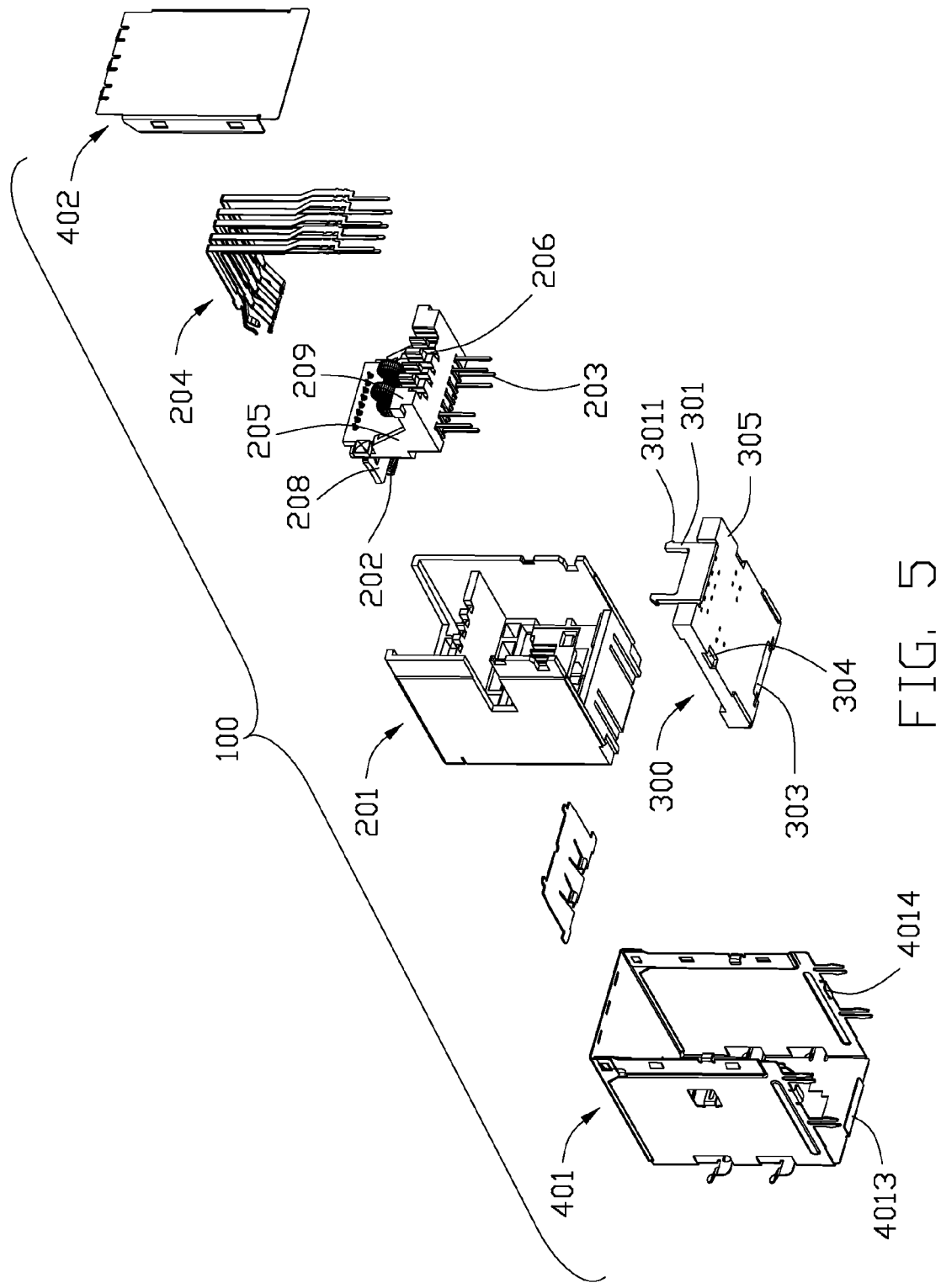
FIG. 5 is another further exploded view of the electrical connector in FIG. 4.
Figure 6:
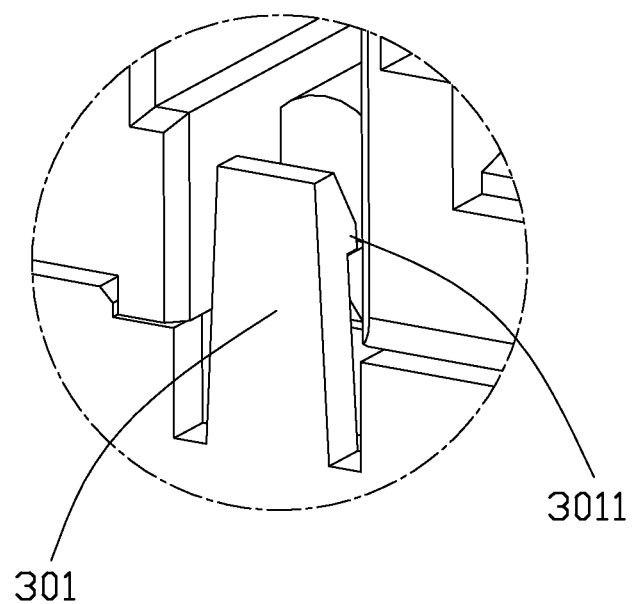
FIG. 6 is a partly enlarged view of a front locking arm engaging a locking block in FIG. 2.
Figure 7:
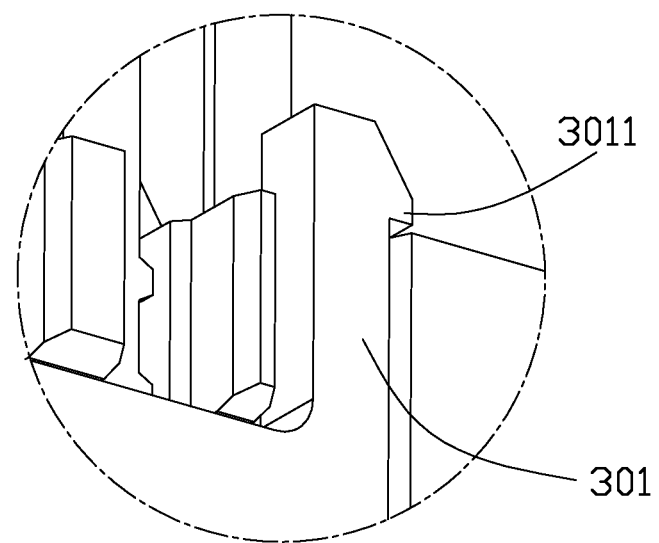
FIG. 7 is a partly enlarged view of a rear locking arm engaging a side portion in FIG. 3.

FIGS. 1-7 show an electrical connector 100 for being mounted onto an external printed circuit board. The electrical connector 100 includes a connector body 200, a connector standoff 300 assembled under the connector body 200, and a shell covering the connector body 200 and the connector standoff 300. The connector body 200 includes an insulative housing 201 and a contact module received in the insulative housing 201. The insulative housing 201 includes a vertical front face 2013 and two mating ports defined in the vertical front face 2013. The two mating ports include an upper mating port 2011 and an RJ45 mating port 2012 defined under the upper mating port 2011. The RJ45 mating port 2012 includes an inner bottom face and two locking sections 2014,2015 extending from the inner bottom face along a down-to-up direction for engaging an RJ45 plug. The insulative housing 201 also includes two slots 2016,2017 defined in the vertical front face 2013 and two supporting blocks 2018,2019 each defined in the slot 2016,2017. The supporting block 2018 is defined in the slot 2016, and the supporting block 2019 is defined in the slot 2017. The slots 2016,2017 are defined in opposite sides of the RJ45 mating port 2012. The slot 2016 is abutting to the locking section 2014, and the slot 2017 is abutting to the locking section 2015.

The contact module includes a spacer 205 and a plurality of contacts received in the spacer 205. The spacer 205 includes a contact supporting board 208, a plurality of vertical front grooves 207, and a plurality of vertical rear grooves 206. The contacts includes a plurality of RJ45 mating contacts 202 defined on the contact supporting board 208, a plurality of RJ45 foot contacts 203 extending downwardly through the vertical front grooves 207 for being mounted onto the external printed circuit board, and a plurality of rear contacts 204 extending downwardly through the vertical rear grooves 206 for being mounted onto the external circuit board. The RJ45 mating contacts 202 extend to the RJ45 mating port 2012. Each of the rear contacts 204 further includes a mating portion extending to the upper mating port 2011 and a foot portion for being mounted onto the external printed circuit board.

The connector standoff 300 includes a base portion 305 and four locking arms 301 extending from the base portion 305 along a down-to-up direction to support the connector body 200. The four locking arms are respectively disposed at diagonal positions. The four locking arms 301 include two front locking arms and two rear locking arms. Each of the front locking arms includes a locking barb 3011 bulging rearwardly, and the locking barbs 3011 of the front locking arms respectively engage the supporting blocks 2018,2019 in the slots 2016,2017. Each of the rear locking arms includes a locking barb 3011 bulging outwardly, and the spacer 205 includes two side portions 209 disposed at opposing lateral sides thereof and extending rearwardly, the locking barbs 3011 of the rear locking arms respectively engaging the side portions 209 of the spacer 205. The connector standoff 300 further includes a plurality of through holes 302. The RJ45 foot contacts 203 and the foot portions of the rear contacts 204 extend downwardly through the through holes 302 for being mounted onto the external printed circuit board.

The shell includes a front shell 401 and a rear shell 402. The front shell 401 includes a front wall 4011 and two side walls 4012 each bent from the front wall 4011 rearwardly. The front shell 401 also includes a first locking portion 4013 extending from a bottom edge of the front wall 4011 rearwardly and two second locking portions 4014 each extending inwardly from a bottom edge of the side wall 4012. The connector standoff 300 includes a first groove 303 and two second grooves 304 in a bottom face. The first locking portion 4013 is received in the first groove 303, and the second locking portions 4014 are respectively received in the second grooves 304.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   a connector body including an insulative housing and a contact module received in the insulative housing, the insulative housing including a vertical front face and a plurality of mating ports defined in the vertical front face, the contact module including a spacer and a plurality of contacts received in the spacer, each of the contacts including a foot portion for being mounted onto an external printed circuit board; and
   a connector standoff assembled under the connector body to support the connector body, the connector standoff extending beyond a bottom face of the insulative housing, the connector standoff including a base portion and four locking arms extending upwardly from the base portion, two of the four locking arms engaging with the spacer, the foot portion extending downwardly through the connector standoff, wherein each of said rear contacts includes a mating portion extending to the upper mating port, wherein the connector standoff includes a plurality of holes for the foot portions to pass through, further comprising a shell covering the connector body and the connector standoff, wherein the shell includes a front shell and a rear shell, the front shell including a front wall and two side walls bent from the front wall rearwardly, the front shell including a first locking portion bent from a bottom edge of the front wall rearwardly and two second locking portions each bent from a bottom edge of the side wall inwardly, the connector standoff including a first groove and two second grooves in a bottom face thereof, the first locking portion received in the first groove, the second locking portions respectively received in the second grooves.

2. The electrical connector as claimed in claim 1, wherein the spacer includes two side portions disposed at opposing lateral sides thereof and extending rearwardly, the spacer further including a plurality of rear grooves disposed between said two side portions, the contacts including a plurality of rear contacts received in the rear grooves.

3. The electrical connector as claimed in claim 2, wherein said four locking arms include two front locking arms and two rear locking arms respectively disposed at diagonal positions of the base portion, each of the rear locking arms including a first locking barb bulging outwardly, two of the first locking barbs respectively engaging said two side portions.

4. The electrical connector as claimed in claim 3, wherein said plurality of mating ports include an upper mating port and a lower RJ45 mating port, and the insulative housing including two slots defined in the vertical front face on opposite sides of the RJ45 mating port, each of the two slots defining a supporting block.

5. The electrical connector as claimed in claim 4, wherein each of said front locking arms includes a second locking barb bulging rearwardly, two of the second locking barbs respectively engaging two supporting blocks.

6. An electrical connector assembly comprising:
   an insulative housing defining a first mating port forwardly communicating with an exterior in a front-to-back direction, said housing defining a bottom face;
   a contact module including a plurality of first contacts extending into the first mating port and connected to a printed circuit board which has electronic components thereon and a plurality of foot contacts are connected thereto, and an insulative spacer through which said foot contacts extend in a regulated manner, said spacer defining a bottom surface located behind the bottom face of the housing; and
   an insulative connector standoff located under both said bottom surface of the spacer and the bottom face of the housing; wherein
   said connector standoff includes a first latch secured to the housing and a second latch secured to the spacer, wherein said defines a plurality of through apertures which the foot contacts extend through, wherein said housing further defines a second mating port having a plurality of second contacts with corresponding tail sections each extending downwardly through corresponding through channels of both said spacer and said standoff, wherein said contact module is configured to include means for assembling said contact module to the housing only forwardly in said front-to-back direction, wherein said spacer further includes unitarily a contact support board extending into the first mating port to support the first contacts, wherein said first latch and said second latch are configured to have the connector standoff assembled to the housing and said spacer along only upwardly in a vertical direction perpendicular to said front-to-back direction.

7. The electrical connector assembly as claimed in claim 6, wherein the first latch is located around a front face of the housing while the second latch is located around a rear face of the spacer.

8. The electrical connector assembly as claimed in claim 6, further including a metallic shell enclosing the housing and the spacer and the connector standoff, wherein said shell defines a locking portion latched to the connector standoff.

9. The electrical connector assembly as claimed in claim 6, wherein said bottom face of the housing and said bottom surface of the spacer are roughly coplanar.

10. An electrical connector assembly comprising:
an insulative housing defining upper and lower mating ports both forwardly communicating with an exterior in a front-to-back direction, said housing defining a bottom face;
a contact module coupled to the lower mating port and including a plurality of lower contacts extending into the first mating port and connected to a printed circuit board which has electronic components thereon and a plurality of foot contacts are connected thereto, and an insulative spacer through which said foot contacts extend in a regulated manner, said spacer defining a bottom surface located behind the bottom face of the housing;
a plurality of upper contacts coupled to the upper mating port, each of said upper contacts defining corresponding downwardly extending tail sections extending through corresponding through channels defined in the spacer in a regulated manner; and
an insulative connector standoff located under both said bottom surface of the spacer and the bottom face of the housing; wherein
said connector standoff defines through apertures through which said foot contacts and said tail sections of the second contacts extend in the regulated manner, wherein each of said rear contacts includes a mating portion extending to the upper mating port, wherein the connector standoff includes a plurality of holes for the foot portions to pass through, further comprising a shell covering the connector body and the connector standoff, wherein the shell includes a front shell and a rear shell, the front shell including a front wall and two side walls bent from the front wall rearwardly, the front shell including a first locking portion bent from a bottom edge of the front wall rearwardly and two second locking portions each bent from a bottom edge of the side wall inwardly, the connector standoff including a first groove and two second grooves in a bottom face thereof, the first locking portion received in the first groove, the second locking portions respectively received in the second grooves.

11. The electrical connector assembly as claimed in claim 10, wherein said spacer includes means for assembling the spacer to the housing only forwardly along said front-to-back direction while said connector standoff includes means for assembling the standoff to the housing only upwardly along a vertical direction perpendicular to said front-to-back direction.

* * * * *